United States Patent [19]
Rodeffer

[11] Patent Number: 5,507,025
[45] Date of Patent: Apr. 9, 1996

[54] METHOD AND APPARATUS FOR SATELLITE RECEIVER WITH VARIABLE PREDETECTION BANDWIDTH

[75] Inventor: Charles E. Rodeffer, Burlington, Iowa

[73] Assignee: Winegard Company, Burlington, Iowa

[21] Appl. No.: 146,605

[22] Filed: Nov. 2, 1993

[51] Int. Cl.$^6$ ................................................ H04N 7/20
[52] U.S. Cl. .......................... 455/266; 455/200.1; 348/726
[58] Field of Search ........................ 455/266, 313–316, 455/207–209, 200.1; 348/726, 727; 329/318, 319; H04N 7/20, 5/455, 5/46

[56] References Cited

U.S. PATENT DOCUMENTS

| | | | |
|---|---|---|---|
| 4,267,605 | 5/1981 | Matsuzawa et al. | 455/266 |
| 4,858,225 | 8/1989 | deSantis | 370/50 |
| 4,939,789 | 7/1990 | Sakashita et al. | 455/260 |
| 5,097,221 | 3/1992 | Miller | 455/266 |
| 5,136,267 | 8/1992 | Cabot | 333/174 |
| 5,303,404 | 4/1994 | Kivelä | 455/200.1 |

OTHER PUBLICATIONS

Beeman, *The effect of high chrominance levels in satellite-delivered video*, Communications Technology, pp. 30–34 & 60, Nov., 1991.

*Primary Examiner*—David E. Harvey
*Attorney, Agent, or Firm*—Dorr, Carson, Sloan & Birney

[57] ABSTRACT

A satellite receiver having first and second stages that are serially coupled so that an output of the first stage feeds into an input of the second stage is provided. Each of the first and second stages includes a tunable oscillator for providing a reference frequency, a means coupled to the input and the tunable oscillator for mixing a frequency modulated (FM) signal on that stage's input with the reference frequency to provide an intermediate frequency (IF) FM signal, and a bandpass filter for filtering the IF FM signal and providing the filtered IF FM signal to that stage's output.

12 Claims, 8 Drawing Sheets

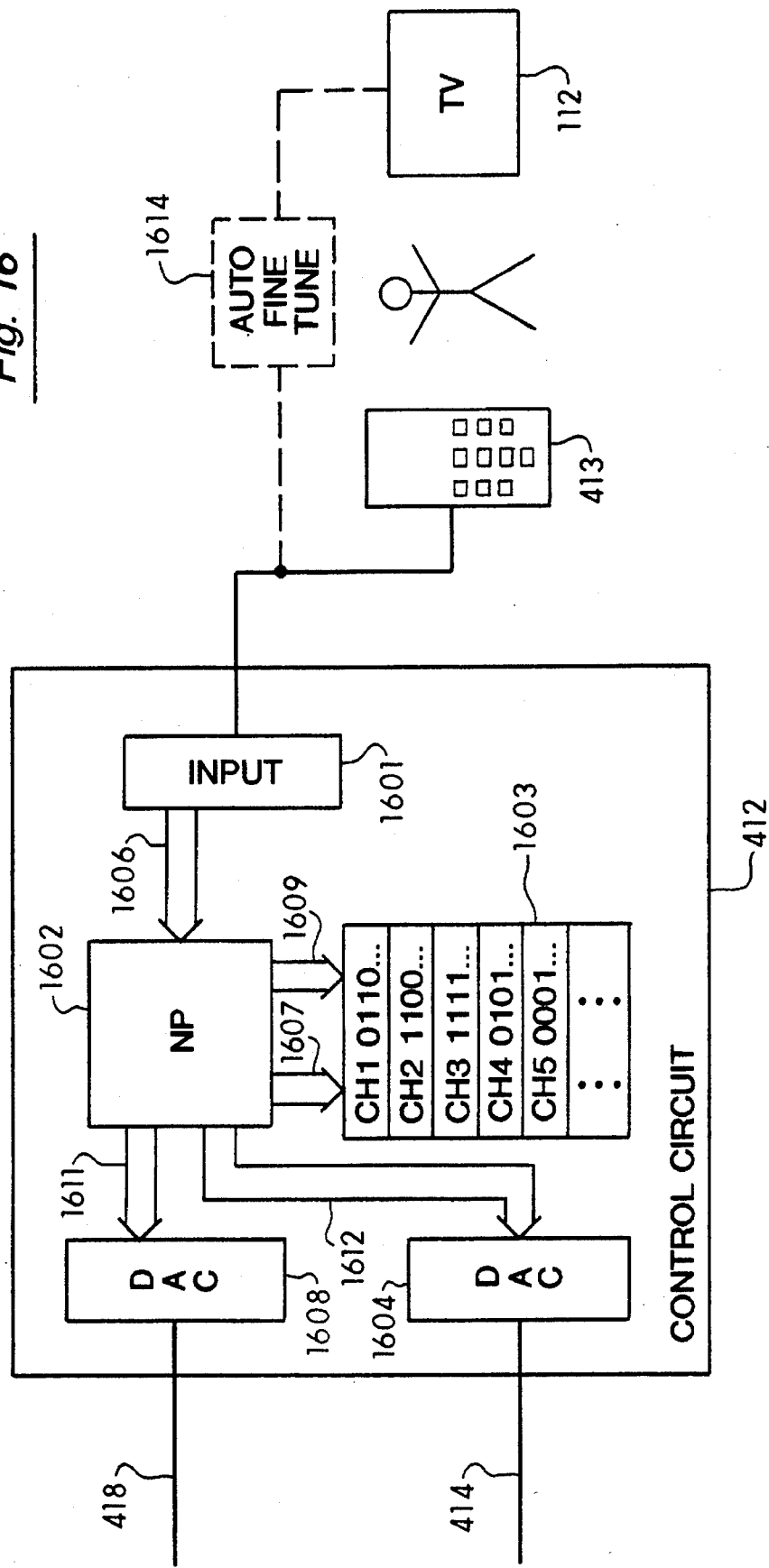

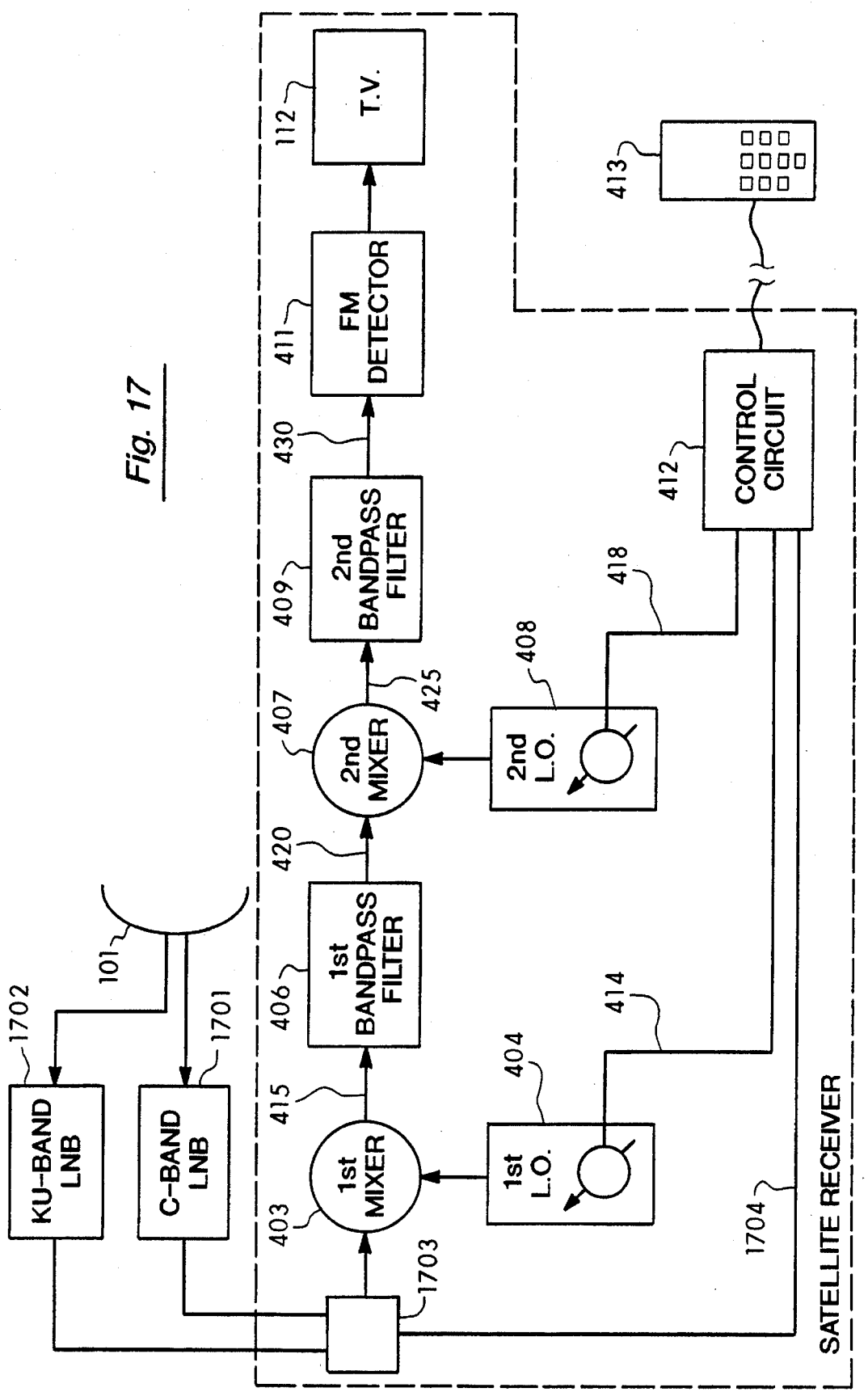

METHOD AND APPARATUS FOR SATELLITE RECEIVER WITH VARIABLE PREDETECTION BANDWIDTH

BACKGROUND OF THE INVENTION

1. Field of the Invention

The present invention relates to satellite receivers for television receive-only (TVRO) antennas, and in particular, the present invention relates to a method and system for varying a predetection bandwidth of a satellite receiver without physically or electrically changing the bandwidths of the intermediate frequency (IF) filters.

2. Statement of the Problem

Satellite-transmitted television is enjoying tremendous growth around the world. A satellite television system includes several geostationary satellites positioned in the Clarke belt around the earth that transmit microwave signals to a receiving antenna positioned on the ground. Usually the receiving antenna is a parabolic dish to receive a low power transmission from the satellite.

The microwave signal transmitted by the satellite is captured by the receiving antenna. The captured signal is processed through a low-noise block downconverter that converts the 3.7–4.2 Gigahertz (GHz) received signal to a lower intermediate frequency (IF) signal of 0.95–1.45 GHz. This process is called downconverting. The signal from the low-noise block downconverter is passed through one or more mixers that reduce the frequency to levels that are easier to convert to baseband television audio and video signals. The signal also passes through one or more bandpass filters that select one channel from the many channels broadcast by the satellite to the receiving antenna.

C-band satellites generally use a frequency or channel plan where each channel comprises a range of frequencies 36 MHz wide with a 2 MHz guard band at the upper and lower frequencies of the channel. The C-band is 500 MHz wide, spreading from 3.7 GHz to 4.2 GHz. A center frequency of each channel is spaced 40 MHz from an adjacent channel, giving 12 channels in a 500 MHz spectrum. A second set of channels, offset by 20 MHz from the first set of channels, is transmitted in an orthogonal polarization to give a total of twenty-four channels.

C-band satellites are positioned in geostationary orbits around the earth and are spaced from each other by two degrees in an orbital arc. Because each of these satellites transmits in the same frequency band, interference between adjacent satellites is a prevalent problem. Channel polarization is coordinated between adjacent satellites to minimize interference. This coordination means that adjacent channels broadcast by adjacent satellites will be like-polarized. For example, channels 1 and 3 are like-polarized with channel 2 of an adjacent satellite. Thus, although polarization coordination is necessary for reduced interference, it cannot eliminate interference to the receiving antenna attempting to receive only channel 2.

A figure of merit for satellite receiving stations is the carrier-to-noise ratio (C/N). C/N is improved by using larger antennas or by broadcasting the signal from the satellite at a higher power or effective isotropic radiative power (EIRP). EIRP varies from satellite to satellite and is completely uncontrollable by the satellite receiver. Large diameter receiving antenna provide adequate C/N even with weak EIRP; however, there is an increasing need and desire for smaller TVRO antennas. C/N can be improved in smaller antennas by narrowing a bandwidth of a filter used to filter the downconverted signal before it is passed to an FM detector. This bandwidth is called the predetection bandwidth.

By narrowing the predetection bandwidth, some of the signal information found at the upper and lower frequencies or "skirts" of the 36MHz channel bandwidth is lost, but the overall signal quality is improved. This lost information results in "video truncation" or loss in quality of the video signal when it is reproduced on the television screen. One particular problem is "chroma truncation" that results in white spots on the TV screen when a high-intensity color signal is broadcast but the signal is truncated by narrow bandwidth filters in the receiving circuitry. It is desirable to narrow the predetection bandwidth as little as possible in order to provide adequate C/N with minimal loss of signal information.

One common solution to this problem is to pick a single predetection bandwidth that is a compromise chosen to optimize performance of the satellite receiver for the most popular satellites and locations on earth. A fixed predetection bandwidth does not provide optimum performance for every satellite that a user wishes to access because it cannot be adjusted for the varying EIRPs of the many satellites. This solution is often acceptable when a large-diameter antenna is used in a fixed location.

Several solutions have been proposed for providing multiple predetection bandwidths in a satellite receiver. One solution is to provide multiple discreet switchable bandpass filters. This increases cost for the satellite receiver as each of the several bandpass filters is expensive. Also, multiple filters are more expensive to assemble than is a single bandpass filter.

Another solution is to provide multiple bandwidths by filters with a bandwidth that can be varied electrically such as with a variable capacitor (VARICAP). Although allowing the satellite receiver to use a single bandpass filter, VARICAPs are expensive, and typically reduce the Q of the bandpass filter to less than that which could be achieved with single-valued components. Moreover, it is desirable to use surface acoustic wave (SAW) filters for their performance, and SAW filters cannot be electrically varied.

Another solution is to provide multiple predetection bandwidths with a bandpass filter in conjunction with selectable or tunable notch filters. The notch filters are designed to greatly attenuate signals above and below the bandpass filter center frequency. This method is commonly referred to as terrestrial interference (TI) filtering. This approach requires multiple filters (at least one bandpass filter and two tunable notch filters) and so increases the cost and complexity of the system. Moreover, the systems are usually designed to limit terrestrial interference rather than carefully control predetection bandwidth.

In many applications it is desirable to provide a small antenna. In particular, the recreational vehicle market places a premium on small antenna designs. A small antenna design will require a narrow predetection bandwidth, for example 25 MHz, when a satellite EIRP is low or adjacent satellite noise is high. However, in some circumstances even a small antenna will have adequate reception with a wider predetection bandwidth. In these circumstances, reception can be improved by increasing the predetection bandwidth to fit the particular circumstances, location, and satellite that is being accessed.

Another problem with satellite receivers is that C-band receivers are not optimized to receive KU-band satellite signals. Unlike C-band, which has a very uniform channel plan, KU-band channels vary considerably in position and bandwidth. For example, each C-band satellite transmits channels one, two, and three at center frequencies of 3720 MHz, 3740 MHz, and 3760 MHz, respectively. One KUband satellite, GE K1, transmits channel one at 11,729 GHz, channel two at 11.7585 GHz, and channel three at 11.788 GHz, respectively. Another KU-band satellite, Galaxy 7, transmits channel one at 11,720 GHz, channel two at 11.750 GHz (horizontal polarity), and channel three at 11.750 GHz (vertical polarity). The GE K1 satellite uses a channel bandwidth of 59 MHz while the Galaxy 7 uses a channel bandwidth of 50 MHz.

Thus, to fine tune a KU-band channel it is necessary to fine tune the predetection bandwidth of the satellite receiver. Conventional receivers require multiple SAW bandpass filters that are expensive. Also, it is impractical to include enough SAW bandpass filters to cover all of the available KU-band channels, so even expensive high-end receivers cannot provide optimum predetection bandwidth for all of the KU-band channels.

Thus, a need exists for a satellite receiving system and method that can provide a variable predetection bandwidth to adapt the satellite receiver to particular circumstances. Further, a satellite receiver is needed to optimize performance of small-diameter antennae, and particularly small-diameter antennas that are frequently moved to new locations. Also, a satellite receiving system with a variable predetection bandwidth is needed-that is relatively low in cost and avoids the use of redundant filter circuits that are often unused. Further, a need exists for a satellite receiver that can be easily fine-tuned to receive C-band, KU-band, and other satellite signals of various channel bandwidths.

SOULTION TO THE PROBLEM

The present invention provides a solution to the above-stated problems by providing a satellite receiver having a variable bandwidth predetection circuit. In circumstances when carrier-to-noise ratio (C/N) must be maximized, the predetection bandwidth can be narrowed. In circumstances when a lower C/N ratio is adequate, the predetection bandwidth can be widened to reduce signal truncation caused by narrower bandwidth predetection filters. The present invention solves the problem of adjacent satellite interference by providing control over attenuation of the upper and lower frequency skirts of a selected channel to attenuate the signal only when an interfering signal is present. Because the predetection bandwidth is under user control, reception and fine-tuning of KU-band signals is possible even when the channel bandwidth varies from one satellite to another.

SUMMARY OF THE INVENTION

The present invention provides a satellite receiver having first and second stages that are serially coupled so that an output of the first stage feeds into an input of the second stage. Each of the first and second stages includes a tunable oscillator for providing a reference frequency, a means coupled to the input and the tunable oscillator for mixing a frequency modulated (FM) signal on that stage's input with the reference frequency to provide an IF FM signal, and a bandpass filter for filtering the IF FM signal and providing the filtered IF FM signal to that stage's output.

The received signal is downconverted and mixed with a signal from a first tunable oscillator to provide a first IF signal that is fed to a first bandpass filter. The frequency of the first tunable oscillator is chosen so that the first IF signal is offset with respect to the pass band of the first bandpass filter. A second mixer mixes the filtered first IF signal with a second tunable oscillator. Choosing frequencies of the first and second oscillators accurately controls the width of the predetection bandwidth and a variable bandwidth bandpass filter is provided.

BRIEF DESCRIPTION OF THE DRAWING

FIG. 16 shows, in block diagram form, detail of control circuitry used in the satellite receiver in accordance with the present invention; and FIG. 17 illustrates in block diagram form a third embodiment satellite receiver system in accordance with the present invention.

DETAILED SPECIFICATION

1. Overview

Figure 1:
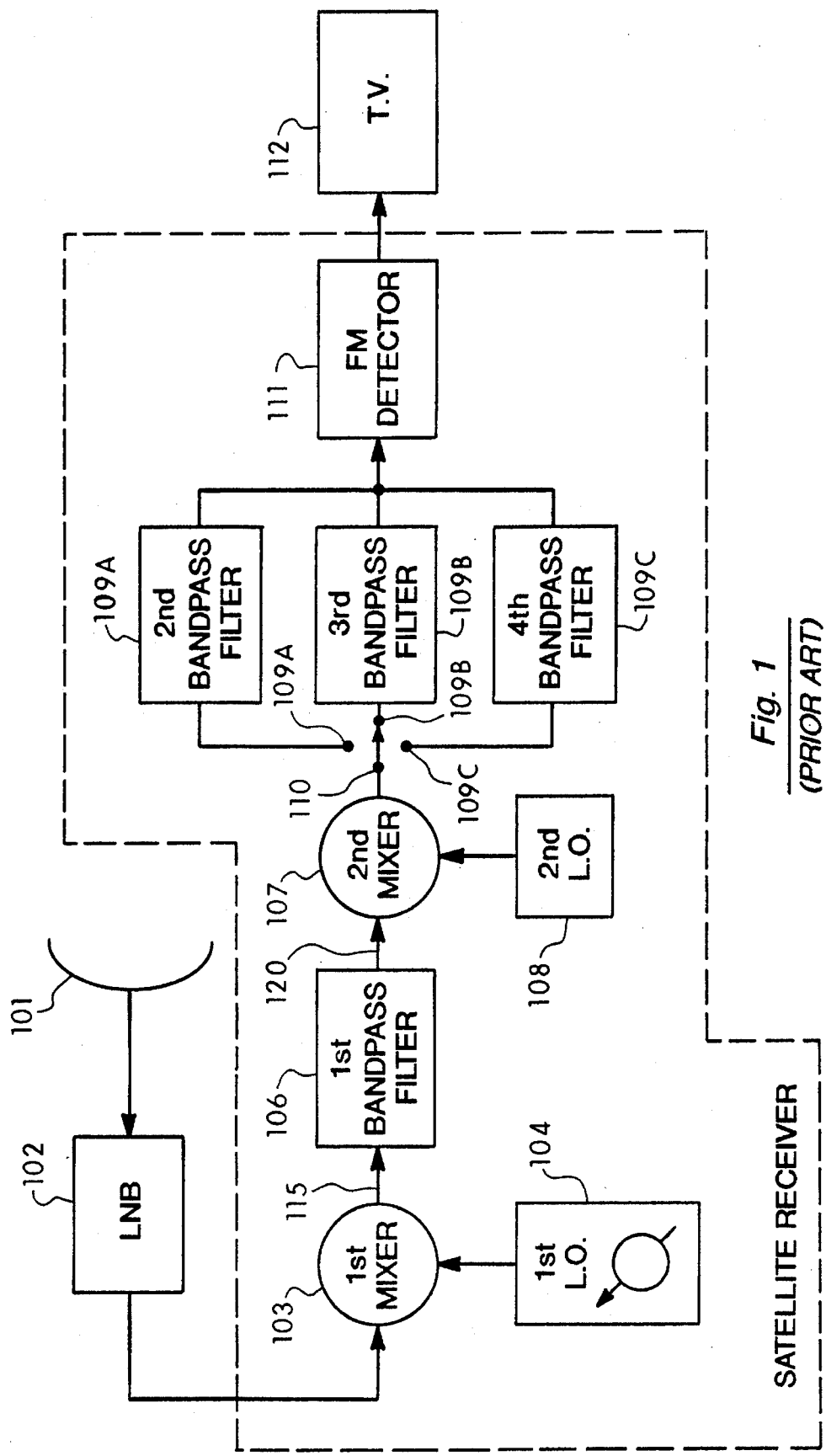
FIG. 1 illustrates in block-diagram form a prior art satellite receiver.

FIG. 1 illustrates a typical prior art satellite receiver system in block diagram form. Antenna 101 receives the satellite broadcasts and is usually a parabolic reflector-type antenna. In the case of the C-band satellite broadcast, a probe (not shown) of antenna 101 picks up a microwave signal in the range of 3.7 to 4.2 GHz. In this microwave signal twenty-four channels are allocated, twelve of which are vertically polarized and twelve of which are horizontally polarized, where each channel is a range of frequencies of about 36 MHz. The like-polarized channels are separated from each other by a 4 MHz guard band. The probe's orientation determines which of the two sets of twelve like-polarized channels are detected by antenna 101.

All twelve like-polarized channels received by antenna 101 are passed to low-noise block (LNB) downconverter 102. The second set of twelve channels in the C-band satellite broadcast that have the opposite polarity are commonly detected rotating the probe (not shown) in antenna 101. Alternatively, two probes with different orientation may be provided in antenna 101 or a second LNB (not shown) may be used to detect the opposite polarity channels. Circuits and methods for detecting the sets of channels with opposite polarity are well known. LNB 102 mixes the received satellite signal with a high-frequency signal generated by a local oscillator inside LNB 102. LNB 102 provides a downconverted signal having a spectrum of about 950 MHz to 1.45 GHz. The downconverted signal from LNB 102 includes all of the twelve channels originally detected by antenna 101. LNB 102 and antenna 101 are conventional components in a satellite receiver system, and are not described in greater detail hereinafter.

The downconverted signal from LNB 101 is passed to a first mixer 103. First mixer 103, together with bandpass filter 106, serves to select one channel from the twelve like-polarized channels passed from LNB 102. Mixer 103 mixes the signal from LNB 102 with a first reference frequency generated by first tunable local oscillator 104 ("1st L.O." in FIG. 1). First mixer 103 outputs a first intermediate-frequency (IF) signal at node 115 to bandpass filter 106. In conventional satellite receivers, mixer 103 is tuned by local oscillator 104 so that the range of frequencies of the selected channel is centered with respect to the pass band (202 in FIG. 2) of bandpass filter 106. In a typical example, the selected channel has a center frequency $f_0$ in the first IF signal at about 610 MHz and local oscillator (LO) 104 generates a frequency in the range of 1560 MHz to 2060 MHz that is adjustable in 40 MHz increments. The filtered first IF signal (301 in FIG. 3) passes from node 120 to second mixer 107.

A second stage of the prior art satellite receiver includes second mixer 107, second tunable local oscillator 108, and one or more bandpass filters such as second bandpass filter 109a, third bandpass filter 109b, and fourth bandpass filter 109c. Second mixer 107 mixes the filtered first IF signal with a second reference frequency provided by second local oscillator 108 to generate a second IF signal.

The second IF signal is at a frequency that is easily detected by FM detector 111. FM detector 111 has a center frequency and a bandwidth in which it can reliable detect the FM encoded signal. In a typical receiver the second IF signal has a center frequency of 70 MHz, which is the center frequency of FM detector 111, although any convenient second IF frequency may be chosen. Second local oscillator 108 generates a fixed reference frequency of 680 MHz to convert the 610 MHz first IF signal to the 70 MHz second IF signal.

The second IF signal passes from second mixer 107 to second, third, or fourth bandpass filter 109a, 109b, or 109c through switch 110. Usually only one of filters 109a through 109c is selected by switch 110 at any given time, so the nonselected filters remain idle. The particular bandpass filter chosen for the second stage is chosen to provide a variable predetection bandwidth to adapt the receiver for a particular signal. The filtered second IF signal passes to FM detector 111, which detects an FM signal encoded in the second IF signal and converts it to a baseband video and audio signal. The baseband video and audio signal is coupled to television 112 for viewing.

The prior art satellite receiver system shown in FIG. 1 is called a "dual conversion" receiver because two mixing stages are used to convert the signal from LNB 102 to a signal suitable for FM detector 111. Other conversion circuits are known; however, the dual conversion methodology is most useful to the understanding of the receiver system of the present invention. Although the system in FIG. 1 has four bandpass filters, it should be understood that low-end prior art systems may include only one bandpass filter in each mixing stage, while high-end systems include more than three bandpass filters to provide more control over the predetection bandwidth. In the past, the amount of control that a user had over the predetection bandwidth was largely, if not entirely, determined by the number of bandpass filters used in the receiver.

Figure 2:
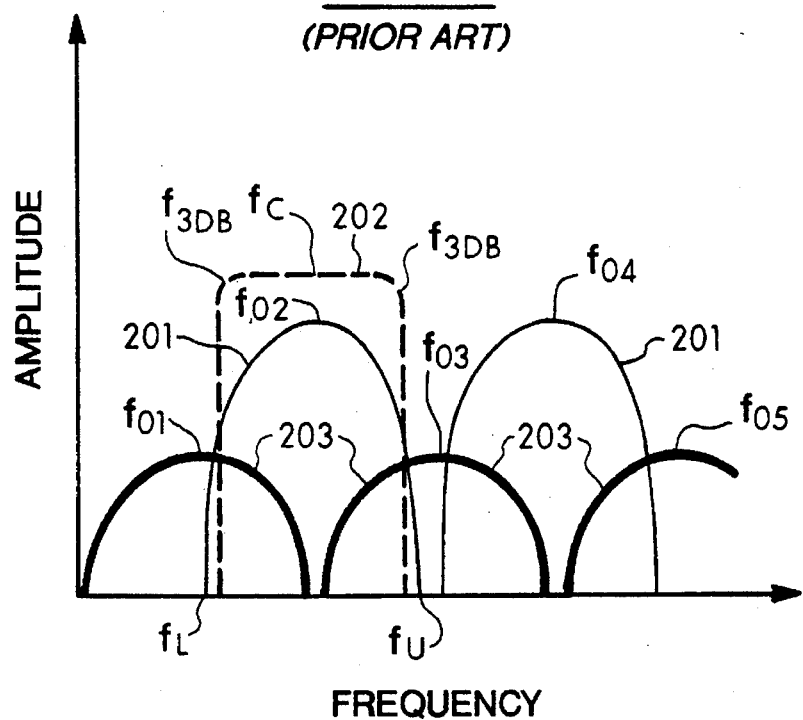
FIG. 2 illustrates a frequency-amplitude plot of a first stage of the prior art receiver shown in FIG. 1.
Figure 3:
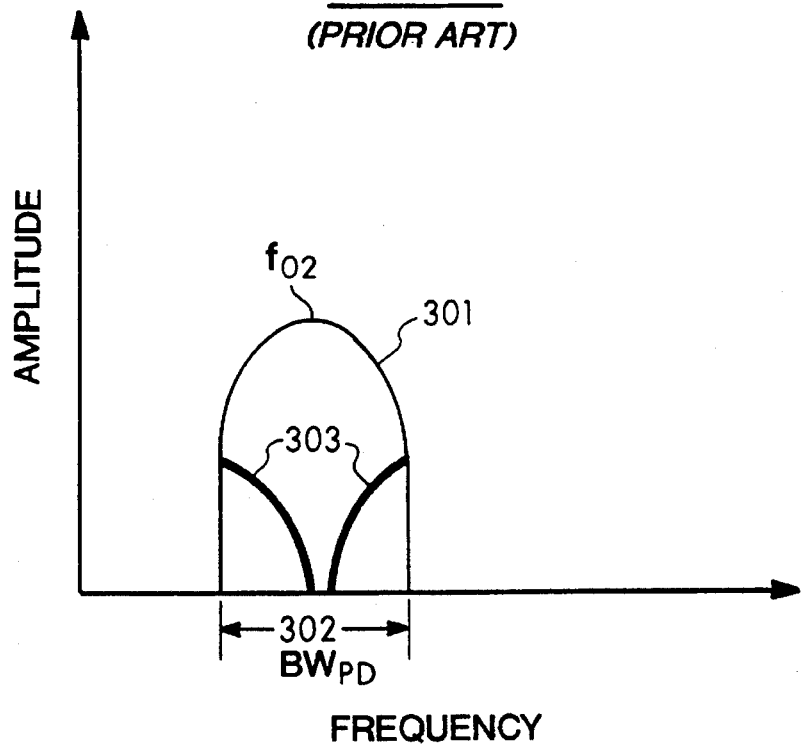
FIG. 3 shows a frequency-amplitude plot of the output from the first bandpass filter of the prior art receiver shown in FIG. 1.

Operation of the prior art satellite receiver is shown in the frequency-amplitude plots shown in FIGS. 2 and 3. In FIGS. 2 and 3, as well as FIGS. 5–14 hereinafter, the vertical axis represents signal amplitude or signal energy, and the horizontal axis is frequency. FIG. 2 is the first IF signal found at node 115 shown in FIG. 1. FIG. 2 shows two lobes 201 that represent adjacent like-polarized channels from a target satellite. Lobes 203, shown in bold lines in FIG. 2 and FIG. 3, represent adjacent like-polarized channels from a satellite that is adjacent or nearby the target satellite. Each channel comprises a range of frequencies from a lower frequency $f_L$ to an upper frequency $f_U$. Each channel also has a center frequency $f_0$. For ease of reference, channel one is identified by center frequency $f_{01}$, channel two is identified by center frequency $f_{02}$, channel three is identified by center frequency $f_{03}$, channel four is identified by center frequency $f_{04}$, and channel five is identified by center frequency $f_{05}$.

In FM transmission, the signal energy of a particular channel will be found at frequencies across the entire range of frequencies $f_L$ to $f_U$ of a particular channel. Although the energy distribution is illustrated by smooth, symmetrical lobes in FIG. 2, it should be understood that actual energy distribution varies across the channel's range of frequencies depending on the signal amplitude of the underlying video and audio information. Thus, the energy peak for channel 2 may not, and often does not, occur at $f_{02}$, for example. As the amplitude of the underlying video and audio information increases, the signal energy becomes more concentrated at the outer-lying frequencies near $f_L$ and $f_U$ rather than appearing near $f_{02}$. The outer-lying frequencies near $f_L$ and $f_U$ are referred to as the "skirts" of the channel signal.

Dashed line 202 is a pass band of first bandpass filter 106 shown in FIG. 1. Pass band 202 has a fixed center frequency $f_c$ and is characterized by upper and lower frequencies where the signal attenuation caused by first bandpass filter 106 is greater than 3-db, indicated by upper and lower $f_{3db}$ points in FIG. 2. The $f_{3db}$ points are also called "roll off" or "cut off" frequencies. The frequency span between the $f_{3db}$ points is called the 3-db bandwidth of the bandpass filter 106. As shown in FIG. 2, the 3-db bandwidth is typically less than the bandwidth of the selected channel so that the skirts of the channel are cut off by bandpass filter 106. In prior art receivers, the center frequency $f_c$ of first bandpass filter 106 is substantially the same as the center frequency $f_{02}$ of the selected channel.

The prior art receiver produces a filtered first IF signal 301 shown in FIG. 3 that has a predetection bandwidth ($BW_{PD}$)

302 determined by the bandwidth of bandpass filter 106. The filtered first IF signal 301 contains residual interference lobes 303, shown in bold in FIG. 3, that are within the passband 202 (FIG. 2) of bandpass filter 106 (FIG. 1). The filtered first IF signal 301 of the prior art receiver is symmetrically positioned about $f_{o2}$. It should be understood that bandpass filters 109a, 109b, and 109c in FIG. 1 will typically have a smaller bandwidth than filter 106, and so will determine the final predetection bandwidth of the receiver.

Although the present invention is described and illustrated in terms of a C-band satellite receiver, other communications bands, such as the KU-band, are available. The receiver in accordance with the present invention is useful in receiving signals in these other communications bands. Further, the present invention is particularly useful for receiving FM television signals broadcast by satellites, but is also useful for receiving any FM signal from any source that is susceptible to interference or variable bandwidth transmission.

2. Variable Bandwidth Receiver System

Figure 4:
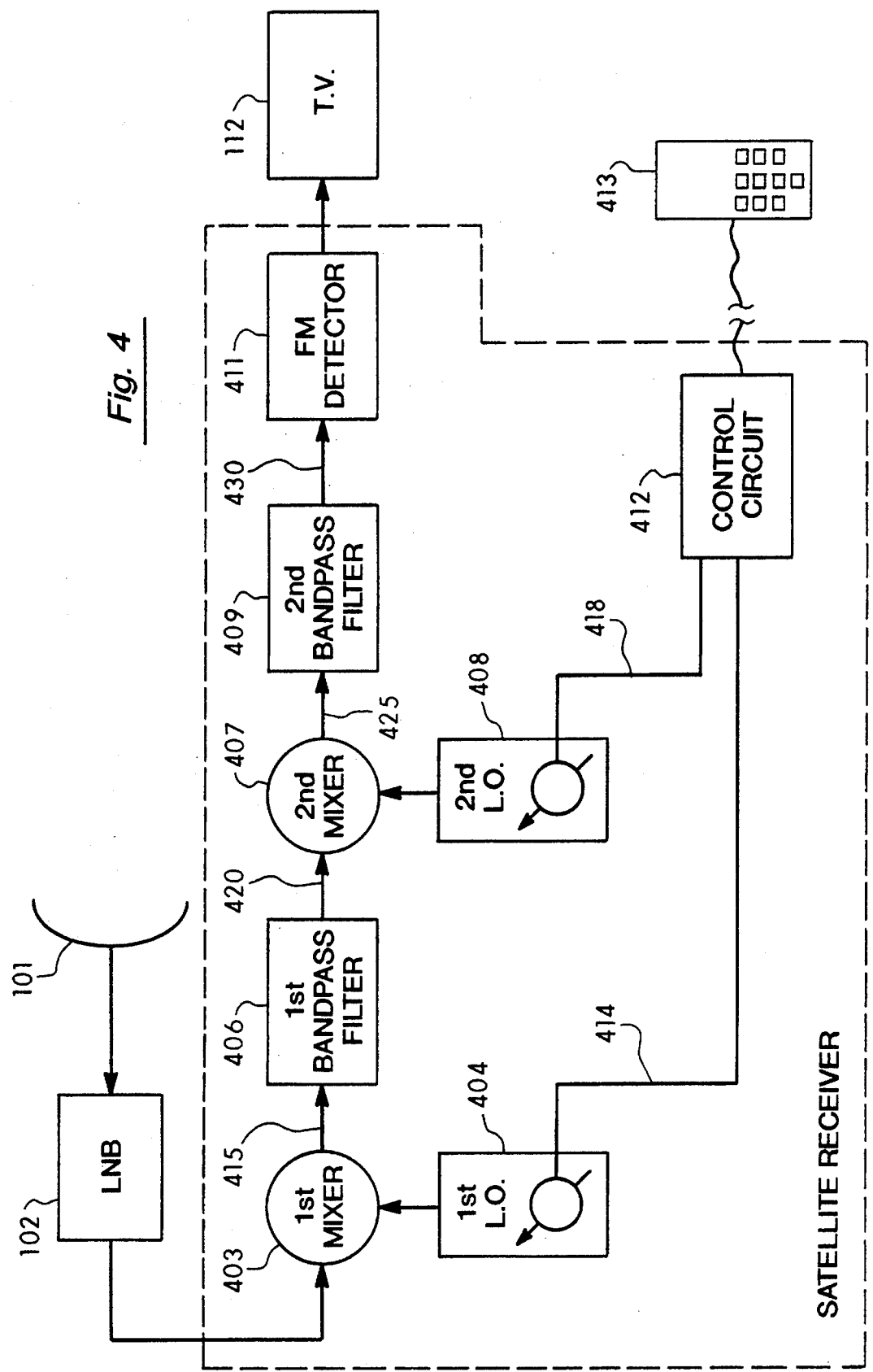
FIG. 4 illustrates the satellite receiver system in accordance with the present invention.

A variable bandwidth receiver system in accordance with the present invention is illustrated in FIG. 4. Front-end components such as antenna 101, LNB 102, and any associated amplifier circuitry (not shown) operate in a manner similar to that described above, and so bear the same identification labels in FIG. 4. The receiver in accordance with the present invention has a first stage including first mixer 403, first tunable local oscillator 404, and first bandpass filter 406. A second stage includes second mixer 407, second tunable local oscillator 408, and second bandpass filter 409.

First mixer 403 has a first input for receiving the downconverted signal from LNB 102 and a second input for receiving a first reference frequency from first tunable local oscillator 404. First mixer 403 produces a first IF signal on line 415 coupling first mixer 403 to first bandpass filter 406. A filtered first IF signal is provided on line 420 which is the output of first bandpass filter 406 and the input to second mixer 407.

The filtered first IF signal passes from first bandpass filter 406 to a first input of second mixer 407. A second reference frequency provided by second tunable local oscillator 408 is coupled to a second input of second mixer 407. Second mixer 407 mixes the filtered first IF signal with the second reference frequency to generate a second IF signal on line 425, which is an output of second mixer 407 and an input to second bandpass filter 409. Second bandpass filter 409 provides a filtered second IF signal on its output line 430 to FM detector 411.

An important feature of the present invention is that both first local oscillator 404 and second local oscillator 408 are tunable. First and second tunable local oscillators 404 and 408 are preferably phase-locked loop oscillators, and thus the reference frequency can easily be varied incrementally or continuously. First and second bandpass filters 406 and 409 are preferably surface acoustic wave (SAW) bandpass filters having a fixed center frequency and 3-db bandwidth. In a particular example, first bandpass filter 406 has a $f_c$=612 MHz and a 3-db bandwidth of 28 MHz, while second bandpass filter 409 has $f_c$=70 MHz and a 3-db bandwidth of 25 MHz, The second IF signal on lines 425 and 430 is preferably a frequency range easily detected by FM detector 411. The bandwidth of the filtered second IF signal on line 430 is the predetection bandwidth ($BW_{PD}$) of the receiver. FM detector 411 is used to detect an FM signal or signals encoded in the filtered second IF signal on line 430. FM detector 411 differs from FM detector 111 in FIG. 1 in that it has sufficient bandwidth to detect the variable predetection bandwidth of the filtered second IF signal on line 430. FM detectors 411 with sufficient bandwidth are commercially available, and the construction and operation of FM detector 411 are well known. FM detector 411 provides a baseband video and audio output to television 112 where the audio and video information encoded in the selected channel is presented to the user.

First and second local oscillators 404 and 408 are controlled either directly by the user of the TVRO system or automatically by control circuit 412. A user can simply watch TV 112 and fine-tune first and second local oscillators 404 and 408 to optimize signal reception and minimize video truncation. Manual tuning will often be cumbersome, however, and automatic or semi-automatic tuning is preferable using control circuit 412 and keypad 413. Details of control circuit 412 are presented hereinafter.

In summary, the satellite receiver in accordance with the present invention comprises first and second stages. Each stage has an input and an output where the first and second stages are serially coupled so an output of the first stage feeds into an input of the second stage. Each of the first and second stages also has a tunable oscillator for providing a reference frequency and a mixer for mixing the reference frequency of that stage with the input to that stage. Each stage also produces an IF signal. The IF signal from the first stage is passed to the second stage, and the IF signal from the second stage is passed to an FM detector.

2. Operation of the Satellite Receiver System

Operation of the satellite receiver in accordance with the present invention is illustrated in the signal amplitude-frequency plots shown in FIG. 5 through FIG. 14. The satellite receiver in accordance with the present invention can be operated in a first "symmetrical" mode that is particularly useful when a variable predetection bandwidth is desired to maximize C/N in low-EIRP environments, but when interference from adjacent satellite broadcasts is not a problem. A second "asymmetrical" mode of operation is useful when adjacent satellite interference is a problem. Also, in either the symmetrical or asymmetrical mode, the satellite receiver can be controlled manually as well as automatically or semi-automatically by control circuit 412 shown in FIG. 4.

Figure 5:
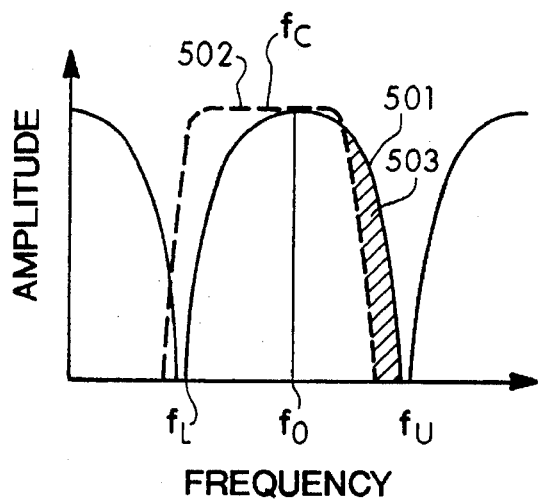
FIG. 5 is a simplified frequency-versus-signal amplitude diagram illustrating operation of a first stage of the satellite receiver system shown in FIG. 4.

In either symmetrical or asymmetrical operation, first local oscillator 404 is tuned such that the first IF signal 501 shown in FIG. 5 output from mixer 403 is offset with respect to the pass band 502 of first bandpass filter 406. This is evident by comparison of FIG. 5 with the prior art output shown in FIG. 2. In FIG. 5, $f_0$, the center frequency of the selected channel, is offset from $f_c$, the center frequency of pass band 502. Hence, as first IF signal 501 passes through bandpass filter 406, a portion (illustrated by shaded area 503) of first IF signal 501 outside pass band 502 is attenuated. This produces a filtered first IF signal 601 shown in FIG. 6 having portion 503 removed.

It is important to note that the position of the selected channel in the first IF signal 501 with respect to pass band 501 is completely controlled by the setting of local oscillator 404. Thus, when local oscillator 404 is a phase-locked loop oscillator, the size of the upper skirt that is removed by first bandpass filter 406 can be varied incrementally in steps equal to the frequency step of first local oscillator 404 over the entire range of frequencies produced by first local oscillator 404.

Figure 6:
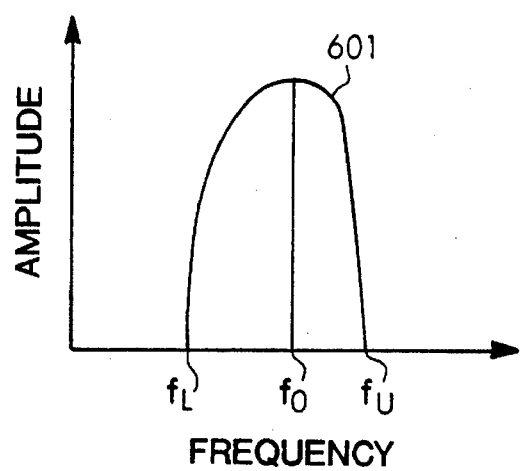
FIG. 6 is a diagram showing the operation of a first bandpass filter of the first stage of the satellite receiver system in accordance with the present invention.
Figure 13:
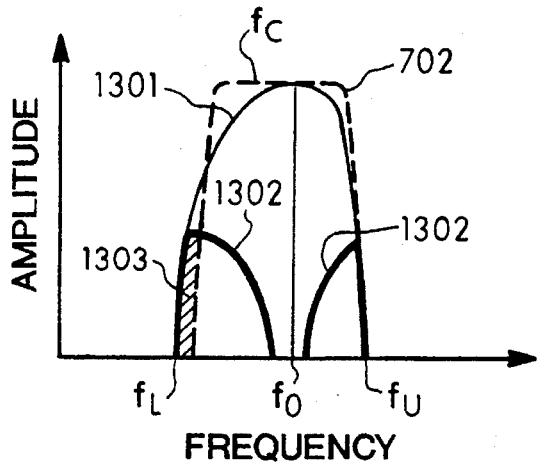
FIG. 13 shows the operation of the second stage processing the signal from FIG. 10 in the asymmetrical operation mode.
Figure 14:
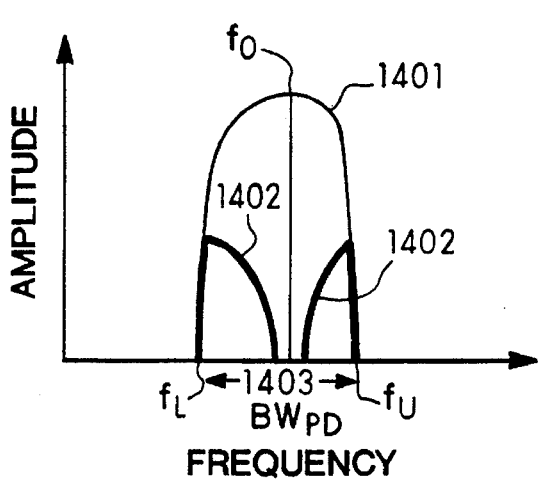
FIG. 14 shows the output of the second bandpass filter processing the signal shown in FIG. 13.

In a preferred embodiment first local oscillator 404 has a range from zero to one-half the channel width, or 18 MHz for a 36 MHz C-band channel. With a one-half channel width range, $f_0$ in FIG. 5 can be moved from alignment with $f_c$ to approximately halfway between $f_c$ and either the upper or lower $f_{3db}$ (shown in FIG. 2) of pass band 502. The first filtered IF signal 601 shown in FIG. 6 is then processed by the second mixer 407 and bandpass filter 409 either symmetrically as shown in FIGS. 7–8 and FIGS. 11–12, or asymmetrically as shown in FIGS. 13–14.

Hence, under the teachings of the present invention, the first local oscillator 404 is made variable between ±0.5 ($f_U$–$f_L$) on either side of $f_0$ so as to enable removal of a portion of either the left or right skirt of the signal 501 with respect to the fixed bandwidth 502 having a center frequency $f_C$. While this removes some audio and video signal information, as will be explained later it functions with the second tunable local oscillator to improve signal reception.

A. Symmetrical Mode Operation

A first mode of operation of the satellite receiver of the present invention is called the "symmetrical variable bandwidth" mode. This mode is called symmetrical because the filtered second IF signal 801 (FIG. 8) that is presented to FM detector 411 has a symmetrically shaped frequency spectrum where the frequency deviation above center frequency $f_0$ is substantially the same as a frequency deviation below the center frequency of the filtered second IF signal 801.

Figure 7:
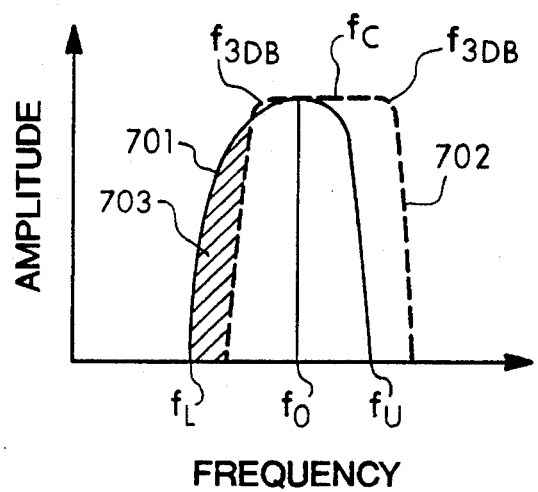
FIG. 7 is a simplified frequency-versus-signal amplitude diagram illustrating the operation of a second stage of the satellite receiver system shown in FIG. 4.

CASE 1:

The symmetrical mode of operation is first described with reference to an input signal 501 in FIG. 5 in which there is little or no interference from adjacent satellites broadcasting in frequency ranges that overlap the selected channel frequency range. The filtered first IF signal 601 (FIG. 6) then passes to second mixer 407 (FIG. 4) that outputs second IF signal 701 shown in FIG. 7. The dashed line curve in FIG. 7 represents pass band 702 of the second bandpass filter 409 in FIG. 4. The lobe shown in FIG. 7 represents the second IF signal 701 produced by second mixer 407.

It is important to understand that the second IF signal 701 can be moved back and forth along the frequency axis with respect to the pass band 702 by adjusting the second reference frequency provided by second local oscillator 408, thus altering the center frequency $f_0$ of second IF signal 701 output from second mixer 407. Hence, the size of the lower skirt (shown by shaded portion 703) that is removed by second bandpass filter 409 can be varied incrementally in steps equal to the frequency step of second local oscillator 408 over the entire range of frequencies produced by second local oscillator 408.

Preferably, second local oscillator 408 has a range from zero to plus or minus one-half the channel width, or 20 MHz for a 40 MHz C-band channel. With a one-half channel width range, $f_0$ in FIG. 7 can be moved from alignment with $f_c$ to alignment with either the upper or lower $f_{3db}$ (shown in FIG. 3) of pass band 702. The first and second bandpass filters 406 and 409 must each have a bandwidth greater than the minimum predetection bandwidth of the system. This is because they are serially connected such that the predetection output shown in FIG. 8 can be no wider than the smallest bandwidth filter in the series.

Figure 8:
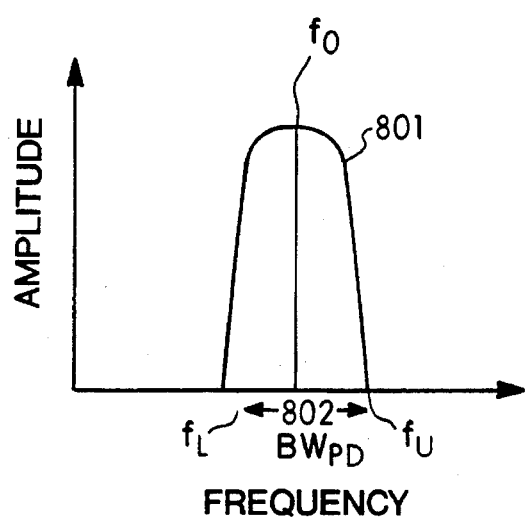
FIG. 8 is a simplified frequency-amplitude diagram illustrating output from a second bandpass filter in the second stage of the satellite receiver system shown in FIG. 4.
Figure 9:
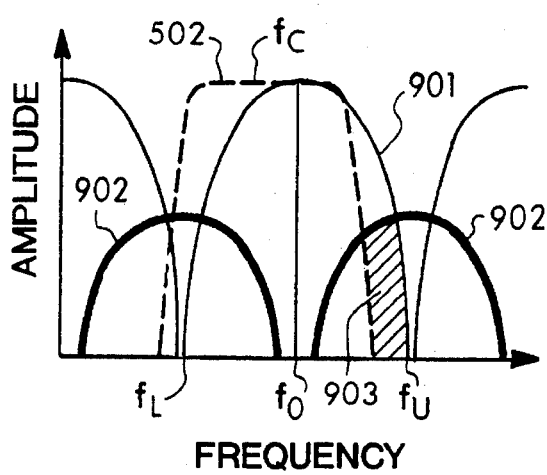
FIG. 9 is a simplified frequency-amplitude diagram illustrating an asymmetrical operation mode of the first stage of the satellite receiver system shown in FIG. 4.

In symmetrical operation, local oscillator 408 is tuned such that the filtered second IF signal 801 in FIG. 8 is symmetrical about $f_0$. Thus, the filtered second IF signal 801 resembles a signal provided by a single bandpass filter where the pass band is aligned with the central frequency $f_0$ of the range of frequencies comprising the selected channel. This arrangement is particularly useful when adjacent satellite interference is minimal but the broadcast signal is relatively low power, or low-EIRP. In such an environment, the receiver can increase C/N, and thus improve reception, only by narrowing the predetection bandwidth. The satellite receiver in accordance with the present invention thus provides a narrow predetection bandwidth for high C/N in a low-EIRP environment.

This narrow bandwidth, which is the predetection bandwidth 802 of the satellite receiver, is controlled by first and second oscillators 404 and 408 rather than by changing components in bandpass filters 406 and 409. Thus, high quality components can be used in filters 406 and 409 and expensive duplication is avoided. Further, construction of first and second bandpass filters 406 and 409 is relatively straight forward and inexpensive since switches and control circuitry are eliminated. Moreover, even though fixed components such as fixed bandwidth SAW filters are used in the bandpass filters 406 and 409, the eventual predetection bandwidth shown in FIG. 8 is completely variable from a very narrow bandwidth that would provide a high C/N to a bandwidth as wide as the narrowest of the first or second bandpass filter 406 or 409.

CASE 2:

Symmetrical operation is also useful when interference is present from adjacent satellites at frequencies above and below the range of frequencies of the selected channel. This situation is illustrated in the lobes 902 in FIG. 9. It will be recalled that adjacent channels from any given satellite normally overlap in frequency ranges, but are broadcast with orthogonal polarization so that the overlapping channels are not detected, and thus do not interfere with the range of frequencies of the selected channel.

However, in adjacent satellites the overlapping range of frequencies of adjacent channels are broadcast with the same polarization as the range of frequencies included in the selected channel. Therefore, the first IF signal generated by mixer 403 resembles that shown in FIG. 9, having interfering lobes 902. The larger lobe 901 represents a channel broadcast by the desired or target satellite, while the lower intensity lobes 902 (shown with bold lines) represent interfering channels broadcast by one or more adjacent satellites.

Figure 10:
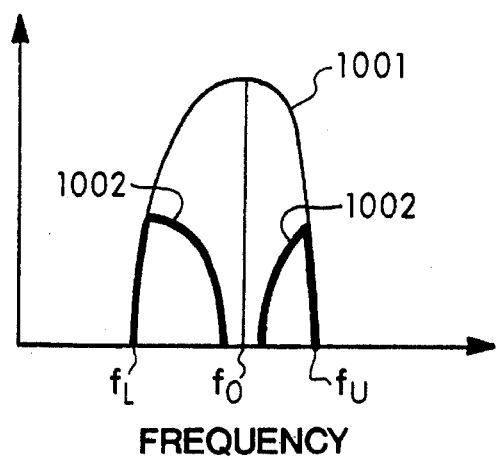
FIG. 10 is a simplified frequency-amplitude diagram illustrating the output from the first bandpass filter in the asymmetrical operation mode.

As described before, the first reference frequency provided by the first local oscillator 404 is selected to position the first IF signal 901 such that the range of frequencies comprising the first selected channel is offset with respect to the pass band 502 of first bandpass filter 406. Portions 903 of interfering channels 902 which are outside of the pass band 502 are removed by bandpass filter 406. The resulting filtered first IF signal 1001 is shown in FIG. 10, which portions 903 removed. The first filtered IF signal 1001 has greatly attenuated the upper interfering channel and cut off portion 903 of the lower interfering channel resulting in attenuated interference lobes 1002 in FIG. 10.

Figure 11:
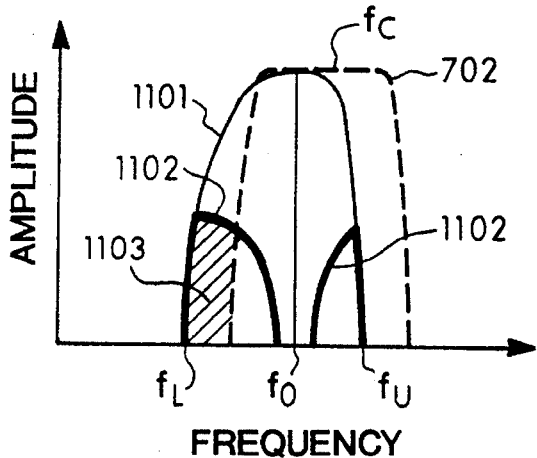
FIG. 11 illustrates operation of the second stage of the satellite receiver system processing the signal from FIG. 10 in the symmetrical operation mode.

When the first filtered IF signal 1001 is mixed with the second reference frequency, the second reference frequency is chosen to align the second IF signal 1101, shown in FIG. 11, with the pass band 702 of the second bandpass filter 409 (shown in FIG. 4). Lobes 1102 represent the interference components in the second IF signal. Again, an important feature of the present invention is that the range of frequencies included in the second IF signal 1101 can be positioned along the frequency axis in relationship to the pass band 702 of the second bandpass filter 409 simply by changing the frequency provided by second local oscillator 408.

Figure 12:
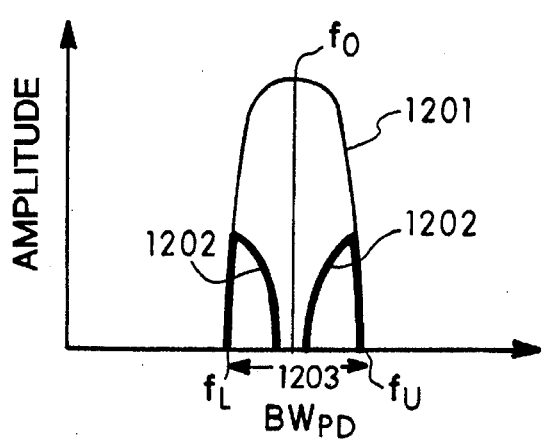
FIG. 12 shows the output of the second bandpass filter processing the signal shown in FIG. 11.

FIG. 12 illustrates the filtered second IF signal 1201 provided to FM detector 411 when the second reference frequency is chosen to provide a symmetrical output. As shown in FIG. 12, a filtered second IF signal 1202 has a narrow predetection bandwidth 1203 symmetrically positioned about center frequency $f_0$ and includes attenuated portions 1202 of the interfering channels 902 (shown in FIG. 9).

B. Asymmetrical Mode Operation

Although the second filtered IF signal shown in FIG. 12 provides good performance, it has been found that performance is further improved by providing a an asymmetrical second IF signal when adjacent satellite interference is present. In asymmetrical mode, the second reference frequency provided by second local oscillator 408 is chosen to position the second IF signal 1301 in FIG. 13 with respect to the pass band 702 of the second bandpass filter 409 so that the filtered second IF signal 1401 in FIG. 14 is asymmetrically positioned about the center frequency $f_0$ as presented to FM detector 411.

Asymmetrical operation is particularly useful when the strength or power distribution of the interfering channels is not equal, allowing the user to controllably attenuate the more interfering channel while at the same time maximizing predetection bandwidth as illustrated by comparing FIG. 14 and FIG. 12. By maximizing the predetection bandwidth, video truncation is minimized. Because the predetection bandwidth is completely controlled by the user, the predetection bandwidth can be narrowed to an acceptable C/N that provides an adequate signal.

In summary, the satellite receiver in accordance with the present invention can operate in a symmetrical or asymmetrical mode. In symmetrical mode, the first stage removes one skirt of the selected channel by providing a first IF signal that is offset with respect to the pass band of a first bandpass filter. The second stage removes a second skirt of the selected channel and compensates for the offset created by the first stage, thereby centering the second IF signal symmetrically about a center frequency. In asymmetrical mode, the second mixer does not compensate for the offset created by the first mixer, but instead is precision tuned by the user to maximize predetection bandwidth to minimize video truncation while providing adequate C/N.

3. Three-Stage Satellite Receiver System

Figure 15:
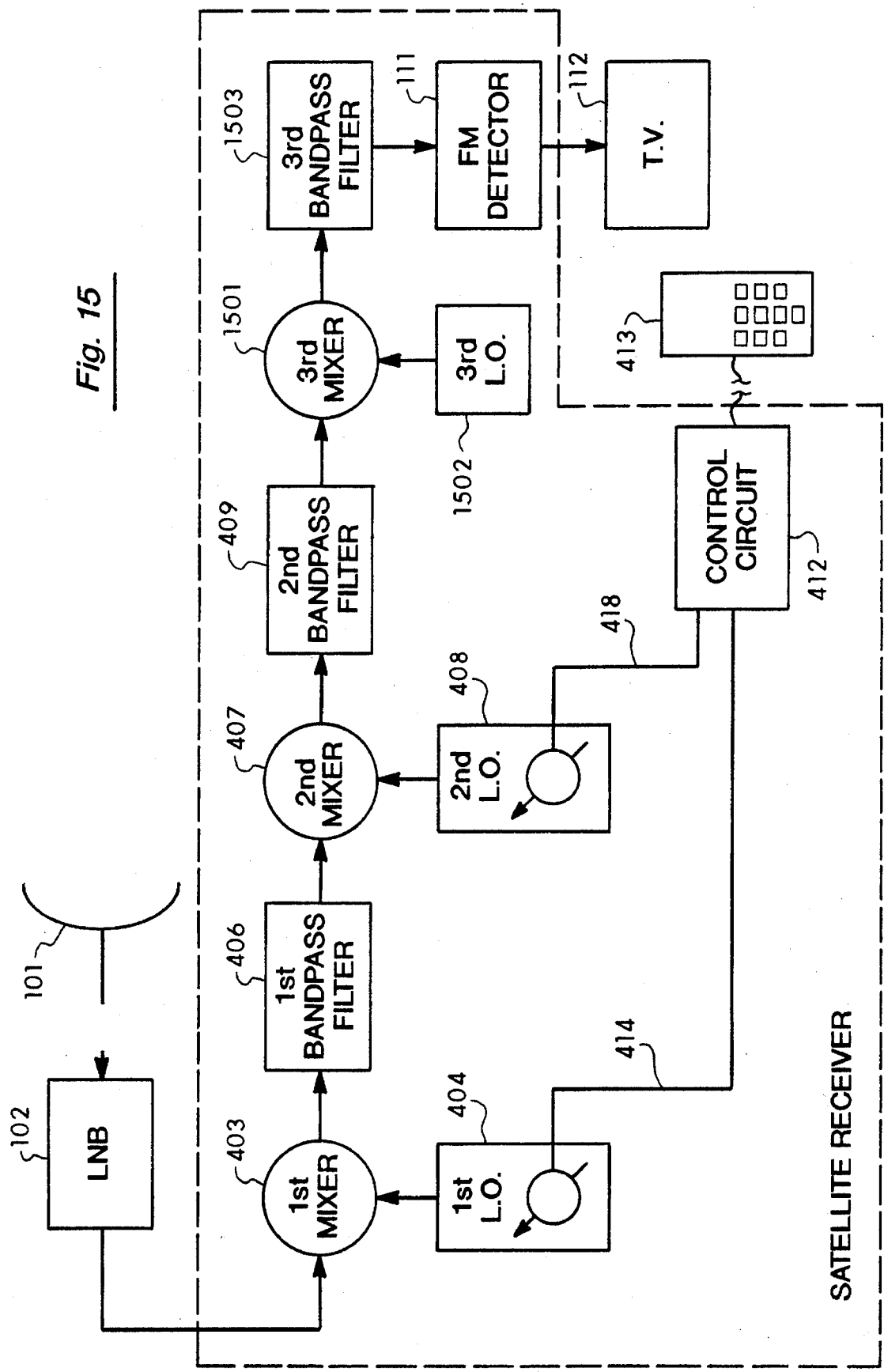
FIG. 15 illustrates a second embodiment satellite receiver system in accordance with the present invention.

A second embodiment of the present invention uses three rather than two series-coupled stages to create the predetection signal sent to FM detector 111. The second embodiment shown in FIG. 15 is useful primarily when the first and second stages are operated in the asymmetric mode described above. The third stage is responsible for centering the filtered second IF signal 1401 about the center frequency of the FM detector 111 before it is presented to FM detector 111.

The third stage includes a third mixer 1501, third local oscillator 1502, and third bandpass filter 1503. The third local oscillator 1502 is also a variable frequency oscillator used to compensate the offset created in the second stage. Hence, the reference frequency generated by the third local oscillator will be determined by the reference frequency of the second local oscillator and can be determined automatically by control circuit 412. By using a third stage to symmetrically center the third IF signal before presentation to the FM detector 111, FM detector 111 does not have to track the offset of the second stage, and so can be substantially the same as FM detector 111 used in the conventional receiver shown in FIG. 1 rather than the wide bandwidth FM detector 411 shown in FIG. 4. This embodiment lowers component cost for FM detector 111 and simplifies construction of FM detector 111 at some increased expense of providing the third stage converter.

4. Automatic and semi-automatic control

Control circuit 412 includes a means for receiving user input such as keypad 413, which may be a hardwired keypad or a wireless remote control. Keypad 413 allows the user to select channels or provide other input to control circuit 412 regarding the actual and desired reception appearing on TV 112. In automatic operation, the user will select a satellite, for example Galaxy 7 or Comsat 4, and select a channel, for example channel 2, using keypad 413. Keypad 413 communicates the user selection to input buffer 1601 of control circuit 412, preferably in digital format either serially or in parallel.

Input buffer 1601 transforms the input signal from keypad 413 to a logic-level digital instruction for microprocessor 1602. Input buffer 1601 transfers the digital instruction via a serial instruction line or parallel instruction bus 1606. Microprocessor 1602 responds to the instruction by addressing memory 1603 via address bus 1607. Memory 1603 is conveniently organized such that each address, indicated by "CH1", "CH2", "CH3", etc., contains a binary word. Memory 1603 has an address location for each channel of each satellite the user can address. Each binary word contains information for driving local oscillators 404 and 408 (shown in FIG. 4) at an desired operating frequency. Memory 1603 provides the addressed binary word to microprocessor 1602 via data bus 1609.

Microprocessor 1602 provides the addressed data word to output bus 1611 and output bus 1612. If local oscillators 404 and 408 can be controlled directly with the addressed binary word, output bus 1611 and output bus 1612 can be coupled directly to control lines 418 and 414. More commonly, however, output circuits 1608 and 1604 will convert the signals on lines 1611 and 1612 to a format more suitable for controlling local oscillators 404 and 408. For example, output circuits 1604 and 1608 may convert the addressed binary word into a series of pulses which increase or decrease the operating frequency of local oscillators 404 and 408. Alternatively, output circuits 1604 and 1608 may be digital-to-analog converters and produce an analog voltage for driving a voltage-controlled oscillator in local oscillators 404 and 408. Many frequency control circuits and methods are known which can be adapted to work with the present invention.

In semi-automatic operation, the stored values represent starting approximations for the local oscillator settings, and the user is able, via keypad 413, to increase or decrease the reference frequencies of local oscillators 404 and 408 to optimize reception. The new settings for the control signals on lines 414 and 418 are then stored in memory 1603 to serve as initial values the next time that channel 2 is selected. Optionally, auto fine-tune circuit 1614, shown by dashed lines in FIG. 16, can be coupled directly to TV 112 to monitor signal quality. Auto fine-tune circuit 1614 provides a control signal directly to input buffer 1601 to augment or replace the control functions performed by the user via keypad 413. Many variations between automatic, semi-automatic, and manual control operation are possible and will be apparent to those skilled in the satellite receiver field.

5. Fine-Tuning KU-band Receiver Operation

It is useful if a single satellite receiver can receive signals in any of the communications bands with as little additional hardware as possible. To receive a signal from a different band, for example the KU-band, a separate LNB 102 (FIG. 1 and FIG. 4) must be provided to downconvert the satellite broadcast to the 950–1450 MHz range. Further frequency conversion and channel selection is much the same as for C-band. However, the prior art receiver shown in FIG. 1 must provide additional bandpass filters such as bandpass filters 109a–109c in order to adapt the receiver to the variable channel bandwidth broadcast by the KU-band satellites.

In accordance with the present invention, the satellite receiver shown in FIG. 17 can be adjusted to provide a predetection bandwidth that is fine-tuned to a KU-band channel without modification of the second bandpass filter 409. FIG. 17 differs from FIG. 4 in that separate LNB's 1701 and 1702 are provided for C-band and KU-band respectively. Components which are the same in FIG. 4 and FIG. 17 bear the same identification numbers. C-band LNB 1701 downconverts C-band satellite broadcast to the 0.95 to 1.45 GHz frequency range. KU-band LNB 1702 downconverts KU-band satellite broadcast to the 0.95– 1.45 GHz frequency range. Switch 1703, under control of control circuit 412 via control line 1704, selects either the output of C-band LNB 1701 or KU-band LNB 1702.

The remaining circuitry in accordance with the present invention is capable of fine-tuning either the C-band or KU-band signal. This is performed in accordance with the present invention by adjusting the reference frequencies of local oscillators 404 and 408 to provide the desired predetection bandwidth. The selection of reference frequencies is similar to that described hereinbefore, and can be performed either symmetrically or asymmetrically. This feature of the present invention greatly increases utility of the satellite receiver by providing both C-band and KU-band reception at great cost savings as compared to buying separate receivers for each band. Moreover, as other communication bands and channel plans are used in the future, the satellite receiver of the present invention can be reprogrammed to receive them without hardware or filter changes.

It is to be expressly understood that the claimed invention is not to be limited to the description of the preferred embodiment but encompasses other modifications and alterations within the scope and spirit of the inventive concept. For example, the satellite receiver may be used with small and large diameter antennas as well as stationary or movable receivers. Also, the present invention is easily adapted to other frequency ranges and signal modulation techniques that involve FM encoding. Accordingly, these and other modifications of the described satellite receiver system and method are within the spirit and claims of the present invention.

I claim:

1. A satellite receiver for tuning a selected channel of a downconverted signal from a satellite broadcast, the downconverted signal having a plurality of channels, wherein the selected channel comprises a range of frequencies, the receiver comprising:

a first mixer having a first input for receiving the downconverted satellite broadcast, a second input for receiving a first reference frequency, and an output for providing a first intermediate frequency (IF) signal;

a first bandpass filter having an input coupled to the output of the first mixer and having an output, wherein the first bandpass filter has a pass band with a bandwidth at least as great as a desired predetection bandwidth of the receiver;

a first tunable local oscillator providing a first reference frequency signal to the second input of the first mixer, wherein the first reference frequency is chosen to offset the range of frequencies of the selected channel with respect to the pass band of the first bandpass filter;

a second mixer having a first input coupled to the output of the first bandpass filter, a second input for receiving a second reference frequency, and an output for providing a second IF signal;

a second bandpass filter having an input coupled to the output of the second mixer and an output, wherein the second bandpass filter has a pass band with a bandwidth at least as great as the desired predetection bandwidth of the receiver;

a second tunable local oscillator providing the second reference frequency to the second input of the second mixer, wherein the second reference frequency is chosen to offset the range of frequencies of the selected channel in the second IF signal with respect to the pass band of the second bandpass filter so that the range of frequencies of the selected channel in the second IF signal is asymmetrically positioned about a center frequency; and detector means having an input coupled to the output of the second bandpass filter for converting the filtered second IF signal to a baseband signal.

2. The satellite receiver of claim 1 wherein the satellite receiver has a predetection bandwidth that is less than the pass band bandwidth of either the first or second bandpass filters.

3. The satellite receiver of claim 1 further comprising a third mixer having a first input coupled to the output of the second bandpass filter, a second input for receiving a third reference frequency, and an output providing a third IF signal, wherein the third reference frequency is selected to position the range of frequencies of the selected channel in the third IF signal symmetrically with respect to a center frequency of the detector means.

4. The satellite receiver of claim 1 wherein the offset of the range of frequencies of the selected channel with respect to the pass band of the second bandpass filter is continuously variable in increments determined by the frequency step size of the second tunable local oscillator.

5. The satellite receiver of claim 1 wherein the selected channel has a bandwidth of approximately 36 MHz and the bandwidth of the first bandpass filter is approximately 28 MHz.

6. The satellite receiver of claim 5 wherein the bandwidth of the second bandpass filter is 25 MHz.

7. The satellite receiver of claim 6 wherein the predetection bandwidth is less than 25 MHz.

8. A method for tuning a selected channel of a downconverted signal from a satellite broadcast, the downconverted signal having a plurality of channels, wherein the selected channel includes a range of frequencies, the method comprising the steps of:

selecting a first reference frequency;

mixing the downconverted signal with the first reference frequency to provide a first intermediate frequency (IF) signals;

filtering the first IF signal using a first filter having a pass band that is offset with respect to the range of frequencies of the selected channel in the first IF signal;

selecting a second reference frequency;

mixing the filtered first IF signal with the second reference frequency to provide a second IF signal; and filtering the second IF signal using a second filter having a pass band that is offset with respect to the range of frequencies of the selected channel in the second IF signal by an amount determined by the value of the selected second reference frequency so that the range of frequencies of the selected channel in the second IF signal is asymmetrically positioned about a center frequency of the selected channel in the second IF signal.

9. The method of claim 8 further comprising a step of converting a frequency modulated (FM) signal from the second IF signal to a baseband signal after the step of filtering the second IF signal.

10. The method of claim 9 further comprising the steps of monitoring the baseband signal and adjusting at least one of the first or the second reference frequency to minimize chroma truncation while providing an adequate carrier-to-noise ratio (C/N).

11. A satellite receiver for receiving both C-band and KU-band satellite transmissions, the receiver comprising:

an antenna providing a satellite broadcast frequency signal;

a first low-noise block downconverter having an input for receiving the satellite broadcast frequency signal and an output for providing a first downconverted signal, wherein the first downconverted signal includes the C-band satellite transmission;

a second low-noise block downconverter having an input for receiving the satellite broadcast frequency signal and an output for providing a first downconverted signal, wherein the second downconverted signal includes the KU-band satellite transmission and the first and second downconverted signals have an overlapping frequency spectrum;

a switch for coupling and decoupling to the outputs of either the first or second low-noise block downconverter for selecting one of the first or second downconverted signals;

a first stage including a first tunable oscillator for providing a first reference frequency, means coupled to the switch and to the first tunable oscillator for mixing the selected one of the first or second downconverted signals with the first reference frequency to provide a first intermediate frequency (IF) signal, and a first bandpass filter for filtering the first IF signal and providing the filtered first IF signal to a first stage output;

a second stage including a second tunable oscillator for providing a second reference frequency, means coupled to the first stage output and to the second tunable oscillator for mixing the first IF signal with the second reference frequency to provide a second IF signal, and a second bandpass filter for filtering the second IF signal and providing the second IF signal to a second stage output, wherein the first and second tunable oscillators are tuned so that when the first downconverted signal is selected the bandwidth of the second IF signal is optimized for a C-band channel, and when the second downconverted signal is selected the bandwidth of the second IF signal is optimized for a KU-band channel.

12. A satellite receiver for tuning a selected channel from a broadcast signal, wherein the selected channel comprises a center frequency, a first skirt at a lower end of the selected channel and a second skirt at an upper end of the selected channel, the receiver comprising:

a first mixer having a first input for receiving the broadcast signal, a second input for receiving a first reference frequency, and an output for providing a first intermediate frequency (IF) signal;

a first bandpass filter having an input coupled to receive the first IF signal and having an output;

a first tunable local oscillator providing a first reference frequency signal to the second input of the first mixer, wherein the first reference frequency is chosen to attenuate a portion of the first skirt of the selected channel at the output of the first bandpass filter;

a second mixer having a first input coupled to the output of the first bandpass filter, a second input for receiving a second reference frequency, and an output for providing a second IF signal;

a second bandpass filter having an input coupled to receive the second IF signal and an output;

a second tunable local oscillator providing the second reference frequency to the second input of the second mixer, wherein the second reference frequency is chosen to attenuate a portion the second skirt of the selected channel at the output of the second bandpass filter, wherein the attenuated portion of the first skirt has a different bandwidth than the attenuated portion of the second skirt.

* * * * *

UNITED STATES PATENT AND TRADEMARK OFFICE
CERTIFICATE OF CORRECTION

PATENT NO. : 5,507,025
DATED : April 9, 1996
INVENTOR(S) : Rodeffer

It is certified that error appears in the above-indentified patent and that said Letters Patent is hereby corrected as shown below:

```
Column 1, line 56, change "elimnate" to --eliminate--
Column 2, line 7, change "36" printed in BOLD to --36--unbolded.
Column 3, line 6, change "11,729" to 11.729--.
Column 3, line 9, change "11,720" to --11.720--.
Column 5, line 54, change "reliable" to --reliably--.
Column 7, line 62, change "MHz," to --MHz.--.
Column 8, line 53, change "are a" to --area--.
Column 10, line 47, change "which" to --with--.
Column 11, line 7, delete "a"--.
```

Signed and Sealed this

Eleventh Day of February, 1997

Attest:

BRUCE LEHMAN

Attesting Officer

Commissioner of Patents and Trademarks